US009991873B2

(12) United States Patent
Henn et al.

(10) Patent No.: US 9,991,873 B2
(45) Date of Patent: Jun. 5, 2018

(54) MICROACOUSTIC COMPONENT AND METHOD FOR THE PRODUCTION THEREOF

(71) Applicant: Snaptrack Inc., San Diego, CA (US)

(72) Inventors: Gudrun Henn, Ebenhausen (DE); Bernhard Bader, Neubiberg (DE)

(73) Assignee: SnapTrack, Inc., San Diego, CA (US)

( * ) Notice: Subject to any disclaimer, the term of this patent is extended or adjusted under 35 U.S.C. 154(b) by 340 days.

(21) Appl. No.: 14/773,290

(22) PCT Filed: Feb. 20, 2014

(86) PCT No.: PCT/EP2014/053350
§ 371 (c)(1),
(2) Date: Sep. 4, 2015

(87) PCT Pub. No.: WO2014/135379
PCT Pub. Date: Sep. 12, 2014

(65) Prior Publication Data
US 2016/0020749 A1 Jan. 21, 2016

(30) Foreign Application Priority Data
Mar. 6, 2013 (DE) .......................... 10 2013 102 217

(51) Int. Cl.
*H03H 3/02* (2006.01)
*H03H 9/25* (2006.01)
(Continued)

(52) U.S. Cl.
CPC ............. *H03H 9/25* (2013.01); *H01L 41/331* (2013.01); *H01L 41/332* (2013.01); *H03H 3/02* (2013.01);
(Continued)

(58) Field of Classification Search
CPC ....................................................... H03H 9/25
See application file for complete search history.

(56) References Cited

U.S. PATENT DOCUMENTS 4,047,129 A 9/1977 Ishiyama
7,443,270 B2 10/2008 Motai
(Continued)

FOREIGN PATENT DOCUMENTS

CN 102714490 A 10/2012
DE 102010005596 A1 7/2011
(Continued)

OTHER PUBLICATIONS

Pornin, J.L., et al., "Wafer Level Thin Film Encapsulation for BAW RF MEMS," ECTC '07 Proceedings, 57th Electronic Components and Technology Conference, May 29-Jun. 1, 2007, pp. 605-609.
(Continued)

*Primary Examiner* — Thomas Dougherty
*Assistant Examiner* — Karen B Addison
(74) *Attorney, Agent, or Firm* — Patterson & Sheridan, L.L.P. Qualcomm (57) ABSTRACT

A microacoustic component includes a functional acoustic region, an inner marginal region and an outer marginal region. The cover covers the functional acoustic region and has a thin film and a bearing surface. The inner marginal region is acoustically coupled to the functional acoustic region and the bearing surface bears directly at least on a part of the inner marginal region.

15 Claims, 5 Drawing Sheets

Fig. 1

(51) Int. Cl.
*H03H 3/08* (2006.01)
*H03H 9/02* (2006.01)
*H03H 9/10* (2006.01)
*H01L 41/331* (2013.01)
*H01L 41/332* (2013.01)
*H03H 9/145* (2006.01)
*H03H 9/05* (2006.01)

(52) U.S. Cl.
CPC .......... *H03H 3/08* (2013.01); *H03H 9/02007* (2013.01); *H03H 9/02086* (2013.01); *H03H 9/02118* (2013.01); *H03H 9/02818* (2013.01); *H03H 9/02858* (2013.01); *H03H 9/02984* (2013.01); *H03H 9/105* (2013.01); *H03H 9/1092* (2013.01); *H03H 9/14544* (2013.01); *H03H 9/0542* (2013.01)

(56) References Cited

U.S. PATENT DOCUMENTS

| | | | |
|---|---|---|---|
| 9,257,960 B2 | 2/2016 | Ruile et al. | |
| 9,876,158 B2* | 1/2018 | Henn | H01L 41/0533 |
| 2007/0024395 A1 | 2/2007 | Motai | |
| 2008/0024041 A1 | 1/2008 | Shibata | |
| 2008/0099428 A1 | 5/2008 | Kubo et al. | |
| 2008/0179995 A1* | 7/2008 | Umeda | H03H 9/02086 |
| | | | 310/324 |
| 2010/0043189 A1 | 2/2010 | Fukano | |
| 2013/0051588 A1 | 2/2013 | Ruile et al. | |
| 2013/0343028 A1 | 12/2013 | Henn | |

FOREIGN PATENT DOCUMENTS

| | | |
|---|---|---|
| EP | 2658122 A1 | 10/2013 |
| JP | 558191 A | 1/1980 |
| JP | 63177605 A | 7/1988 |
| JP | 2005311511 A | 11/2005 |
| JP | 2007036829 A | 2/2007 |
| JP | 2008035119 A | 2/2008 |
| JP | 2008085620 A | 4/2008 |
| JP | 2008182543 A | 8/2008 |
| JP | 2009010122 A | 1/2009 |
| JP | 2010245829 A | 10/2010 |
| JP | 2012186808 A | 9/2012 |
| JP | 2013518455 A | 5/2013 |
| JP | 2014502815 A | 2/2014 |
| WO | 2011088904 A1 | 7/2011 |
| WO | 2012086441 A1 | 6/2012 |
| WO | 2012089443 A1 | 7/2012 |

OTHER PUBLICATIONS

International Search Report and Written Opinion—PCT/EP2014/053350—ISA/EPO—May 27, 2014.

* cited by examiner

MICROACOUSTIC COMPONENT AND METHOD FOR THE PRODUCTION THEREOF

This patent application is a national phase filing under section 371 of PCT/EP2014/053350, filed Feb. 20, 2014, which claims the priority of German patent application 10 2013 102 217.0, filed Mar. 6, 2013, each of which is incorporated herein by reference in its entirety.

TECHNICAL FIELD

The invention relates to a microacoustic component, e.g., a component comprising electroacoustically active regions, wherein a functional region is covered by a cap, and to a method for producing such a component.

BACKGROUND

Microacoustic components comprise a functional region in which acoustic waves are capable of propagation. Such components can include, e.g., electroacoustic transducers comprising electrode structures and a piezoelectric material and operate with SAWs (SAW=surface acoustic wave), with BAWs (BAW=bulk acoustic wave) or with GBAWs (GBAW=guided bulk acoustic wave). Such components can constitute RF filters and be used, e.g., in mobile communication devices.

A characteristic order of sizes of RF filters operating with acoustic waves is substantially provided by the velocity of propagation of acoustic waves in condensed matter and the frequency. At a frequency of 1 GHz and a velocity of propagation of 1000 m/s, a characteristic order of size of 1 µm results. In this regard, for example, adjacent electrode fingers of SAW components or piezoelectric layer thicknesses of BAW resonators are determined by structure sizes of the order of size of 1 µm.

What is problematic about microacoustic components, in principle, is that the functional regions react sensitively to external influences. Therefore, covers are required above the functional regions. However, conventional covers make the production costs more expensive and/or are at odds with the continuous trend towards miniaturization.

What is furthermore problematic about microacoustic components is that complex technical measures for providing an optimum medium for acoustic signals are necessary if stringent requirements are made of the signal quality. In this regard, e.g., one measure for SAW components consists in optimally setting the waveguide properties for different regions of an acoustic track. In this case, the propagation of an acoustic wave, e.g., in a piezoelectric material or at the surface of a piezoelectric material, is dependent on a multiplicity of parameters, such as e.g., the density, the mass per unit area of the medium, the modulus of the elasticity of the medium or the geometry of the functional region, that is to say of the region in which the wave propagates.

SUMMARY

Embodiments of the present invention specify a microacoustic component comprising a cover, wherein the cover does not significantly increase the dimensions of the component and wherein the component has good acoustic properties despite a small structural size. Further embodiments specify a method for producing such a component.

The component comprises a functional acoustic region and an inner marginal region surrounding the functional acoustic region. The component furthermore comprises an outer marginal region surrounding the inner marginal region, and a cover, which covers the functional acoustic region and has a thin film and a bearing surface. The inner marginal region is acoustically coupled to the functional acoustic region. The bearing surface bears directly at least on a part of the inner marginal region.

The microacoustic component can be an electroacoustic component, e.g., a BAW component, an SAW component or a GBAW component having electrode structures for converting between electromagnetic RF and acoustic signals in a piezoelectric subject. The functional acoustic region of the microacoustic component is that region which is provided for the propagation of acoustic waves. Usually, the functional acoustic region of the component cannot be arranged in an absolutely freely floating manner in the component. Therefore, the functional acoustic region of the component is connected to the other parts of the component. Such a connection generally constitutes a bridge via which acoustic waves can emanate from the functional acoustic region into other parts of the component. In the present component, the inner marginal region is at least a part of the connection between the rest of the component and the functional acoustic region and is therefore acoustically coupled to the functional acoustic region. In this case, the outer marginal region is acoustically decoupled from the functional acoustic region in so far as its presence does not have very great influences on the formation of acoustic waves in the functional acoustic region. The cover that covers the functional acoustic region and comprises at least one thin film constitutes the cover of a TFP cover (TFP=thin film package). TFP covers can also be used for covering other miniaturized components.

It is possible for the cover to hermetically enclose the functional acoustic region in a cavity. However, it is also possible for the cover to protect the functional acoustic region against relatively large articles, but otherwise to permit contact between the functional acoustic region and the surrounding atmosphere.

By virtue of the fact that the bearing surface of the cover is directly at least on a part of the inner marginal region, the cover or at least the lower region of the cover is acoustically coupled to the functional acoustic region.

The microacoustic component therefore has the following advantages over conventional microacoustic components:

The bearing surface of the cover, compared with conventional components, is drawn from an outer marginal region at least partly into the inner marginal region, such that the cavity in which the functional acoustic region is arranged below the cover is reduced in size. A component reduced in size is thereby obtained, in principle.

Furthermore, the area of the cover which is not directly connected to the functional acoustic region is reduced in size. The mechanical endurance of the cover to withstand external forces, such as can occur, e.g., during the molding of the component, is thus improved.

As a result of the bearing surface being drawn at least partly into the inner marginal region, the external space requirement is also reduced. Furthermore, the cavity is reduced in size, which facilitates the removal of a sacrificial layer below the cover.

The acoustic coupling of the cover to the functional acoustic region makes it possible to obtain optimized wave modes in the functional acoustic region.

Conventional measures for this purpose, such as e.g., a mass coverage designated as "overlap" at the margin of the functional acoustic region can be omitted or produced in a simplified manner and more expediently as a result.

It has been found, in particular, that the cover can indeed be embodied such that it can be used for improving the oscillation modes despite the complex interaction between the functional acoustic region and the environment thereof from which the acoustic region is usually isolated as well as possible.

The present measures make it possible to obtain covers having the thickness of the characteristic size or cavities having a height of the order of the characteristic size, such that the overall size of the component is substantially not increased by the cover that improves the acoustic properties.

In one embodiment, the component operates with surface acoustic waves or with guided bulk acoustic waves. The component then comprises interdigital electrode figures in the functional acoustic region on a piezoelectric material. In addition or as an alternative thereto, it is possible for the component to operate with bulk acoustic waves and for this purpose to comprise a piezoelectric material in the functional acoustic region between a bottom electrode surface and a top electrode surface.

The functional acoustic region or a region adjoining the functional acoustic region can have acoustic reflectors, e.g., structured strips in the case of surface waves or acoustic mirror layers in the case of bulk waves.

In one embodiment, the mass coverage in the inner marginal region is locally increased by an additional mass in order to suppress undesirable wave modes or in order to improve the waveguiding. The bearing surface of the cover can then bear on the additional mass and improve the effect thereof.

In one embodiment of this component, the additional mass of a frame structure is analogous to a conventional "overlap".

In one embodiment, both the bearing surface and the frame structure in each case have an inner edge. Both inner edges terminate flush with one another.

In one embodiment, the component comprises a structure which reflects acoustic waves.

In one embodiment, the cover encloses a cavity above the functional acoustic region. In this case, the cavity can be hermetically separated from the environment of the component or connected to the environment, e.g., through holes in the cover.

In one embodiment, the microacoustic component comprises a further functional acoustic region and a further cover. One of the two covers encloses a cavity above the associated functional acoustic region. The other cover is arranged directly above the associated functional acoustic region, without enclosing a cavity in which the further functional acoustic region is arranged at a distance from the cover.

If the further cover encloses the further functional acoustic region without a cavity between the functional acoustic region and the cover, the cover is completely acoustically coupled to the functional acoustic region. A BAW resonator or an SAW resonator could thereby be detuned such that it is acoustically inactive in the relevant frequency range. In this way, in addition to acoustically active resonators, capacitive elements can be formed on the same chip by means of simple method steps.

Both functional regions can be arranged one above the other or alongside one another.

The cover can comprise a single thin film or a plurality of thin films arranged one above another. In this case, the cover can have a thickness of between 1 µm and 10 µm, e.g., 3 µm, and comprise silicon oxide, e.g., $SiO_2$, a polymer or a resist known from photolithography processes. Furthermore, the cover can comprise a thin metal layer for shielding or for improving the hermeticity. A further layer, e.g., a polymer layer, which can have a thickness of between 5 and 15 µm, can be arranged above the cover. Said further layer can have a thickness of between 8 and 10 µm, for example.

The overlap or an overlap embodied in a simplified manner can comprise, e.g., a silicon oxide, e.g. $SiO_2$, or silicon nitride, e.g. $Si_3N_4$.

The piezoelectric material can comprise e.g., aluminum nitride (AlN), zinc oxide (ZnO) or lead zirconate titanate (PZT) or a combination of these materials. The piezoelectric material can furthermore be doped, e.g., with scandium (Sc).

A method for producing an electroacoustic component comprises the following steps: providing a carrier substrate, shaping a structure in which microacoustic waves are capable of propagation in a functional acoustic region in, on or above the substrate, arranging a sacrificial layer above the functional acoustic region, depositing a thin film above the sacrificial layer, and removing the sacrificial layer between the thin film and the functional acoustic region.

In this case, the sacrificial layer is applied such that an inner marginal region around the functional acoustic region is not covered by the sacrificial layer. The thin film thereupon deposited can bear directly on the uncovered part of the inner marginal region. After the removal of the sacrificial layer, the thin film forms the cover that covers the functional acoustic region. The cover can comprise even further layers besides the thin film.

The removal of the sacrificial layer is possible, e.g., by the thin film containing a hole or a plurality of holes, such that an etchant can remove the sacrificial layer.

The sacrificial material can comprise silicon, e.g., amorphous silicon, silicon dioxide, metal or sacrificial materials known from lithography processes.

Methods for depositing or structuring layers can comprise conventional measures such as spin-on methods, CVD (chemical vapor deposition), PVD (physical vapor deposition), sputtering or vapor deposition.

BRIEF DESCRIPTION OF THE DRAWINGS

The component and exemplary embodiments are explained in greater detail below with reference to schematic figures.

In the figures.

DETAILED DESCRIPTION OF ILLUSTRATIVE EMBODIMENTS

Figure 1:
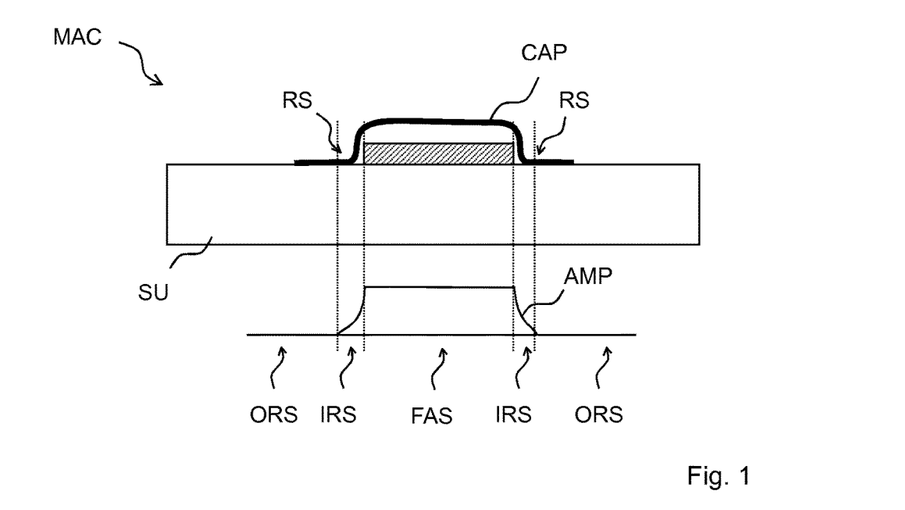
FIG. 1 shows the acoustic coupling of the functional acoustic region to the inner marginal region of a microacoustic component.

FIG. 1 shows the relationship between the functional acoustic region FAS, the inner marginal region IRS and the outer marginal region ORS of a microacoustic component MAC. Acoustic waves are capable of propagation in the functional acoustic region FAS. Ideally, in this case as little acoustic energy as possible is emitted into other regions of the component. In this regard, the outer marginal region ORS and the functional acoustic region FAS are substantially acoustically decoupled. The lower part of FIG. 1 illustrates the amplitude AMP of an acoustic wave in the component. Ideally, the amplitude is substantially constant in the functional acoustic region and zero in the outer marginal region ORS. In the transition region therebetween, the inner marginal region IRS, the amplitude decreases.

The upper part of FIG. 1 shows the corresponding technical features of the component. The cover CAP is arranged above the structures of the functional acoustic region. The bearing region of the cover, that is to say the region with which the cover bears on the other parts of the component MAC, lies at least partly within the inner marginal region IRS. It is also possible for the cover to completely cover the inner marginal region IRS. It is furthermore possible, but not necessary, for the cover CAP to directly touch parts of the outer marginal region, e.g., a carrier substrate SU. By virtue of the fact that the cover CAP bears at least partly on the inner marginal region IRS, the cover is acoustically coupled to the structures of the functional acoustic region and can therefore constitute—alongside the possible reduction in the size of the cover—a simple means for optimizing the propagation of acoustic waves in the functional acoustic region FAS.

Figure 2:
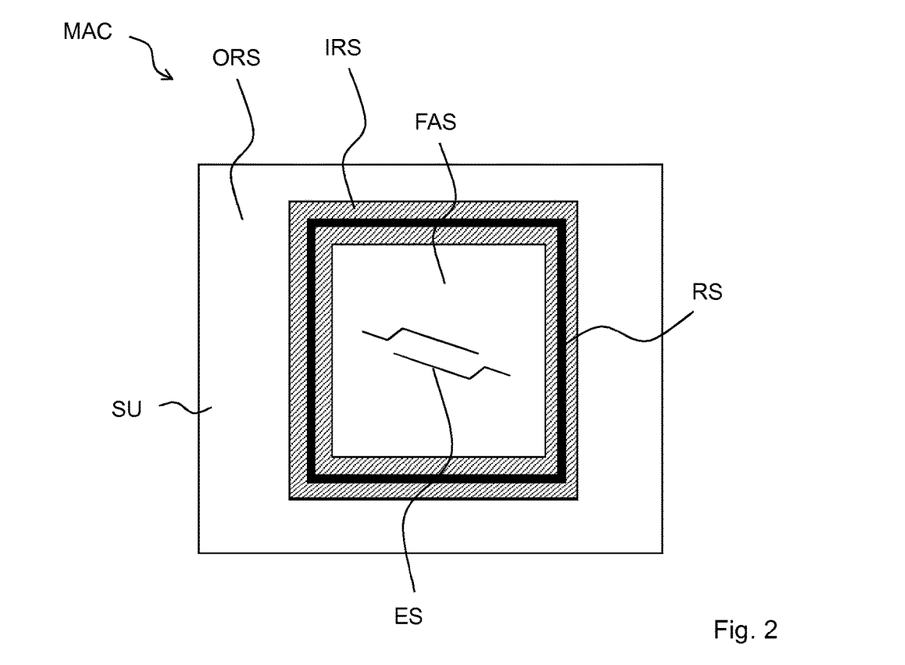
FIG. 2 shows the view of the transverse plane of a component, wherein an inner marginal region separates a functional acoustic region from the outer marginal region.

FIG. 2 shows a horizontal section through a microacoustic component. Electrode structures ES are arranged on a substrate SU. The electrode structures can be electrode fingers of SAW structures or electrode surfaces of BAW structures. The inner marginal region IRS is arranged between the acoustically active functional acoustic region FAS and the acoustically inactive outer marginal region ORS, said inner marginal region being at least partly acoustically coupled to the functional acoustic region FAS. The bearing region RS of the cover (not shown) covers a part of the inner marginal region IRS.

Figure 3:
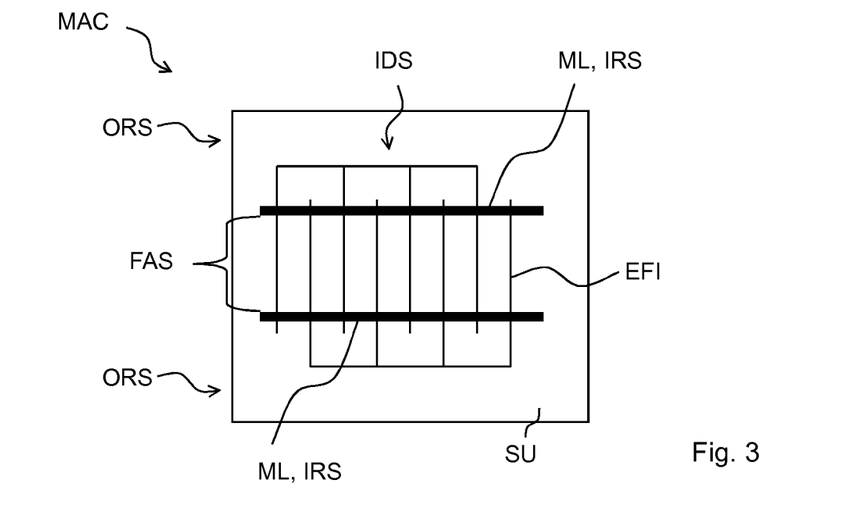
FIG. 3 shows an embodiment that operates with surface acoustic waves or with guided bulk acoustic waves.

FIG. 3 shows a microacoustic component MAC that operates with surface acoustic waves or with guided bulk acoustic waves. For this purpose, it comprises electrode fingers EFE, which are interconnected alternately with one of two busbars and form an interdigital structure IDS. A local mass layer ML at each side of the acoustic track can serve for forming a desired wave mode and is therefore acoustically coupled to the functional acoustic region FAS. The cover can therefore at least partly bear on the two mass layers ML, which constitute a part of the inner marginal region IRS.

Figure 4:
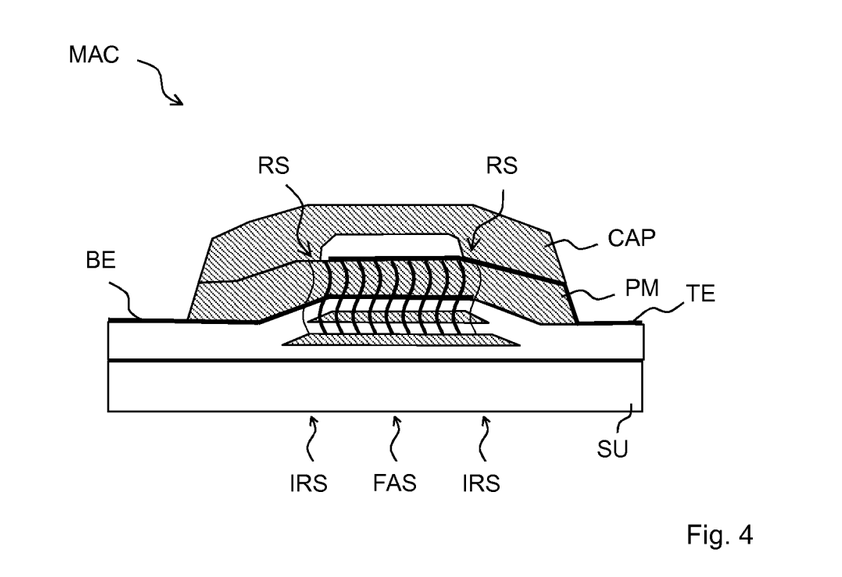
FIG. 4 shows a vertical section through a component that operates with bulk acoustic waves.

FIG. 4 shows a vertical cross section through a microacoustic component MAC. A wavy pattern symbolizes the propagation of acoustic waves. The wave patterns depicted by a thick line in the functional acoustic region FAS symbolize a high amplitude, while wave lines depicted thinner in the inner marginal region IRS represent a coupling that is present in conjunction with a reduced amplitude. The cover CAP bears on the piezoelectric material PM such that the bearing surface RS is arranged directly on the inner marginal region IRS. The piezoelectric material PM is arranged at least in the functional acoustic region FAS between a bottom electrode BE and a top electrode TE, via which the component can be contacted externally. Layers of alternating acoustic impedance below the piezoelectric material PM in the functional acoustic region operate as acoustic mirrors in order to keep acoustic energy in the functional acoustic region.

Figure 5:
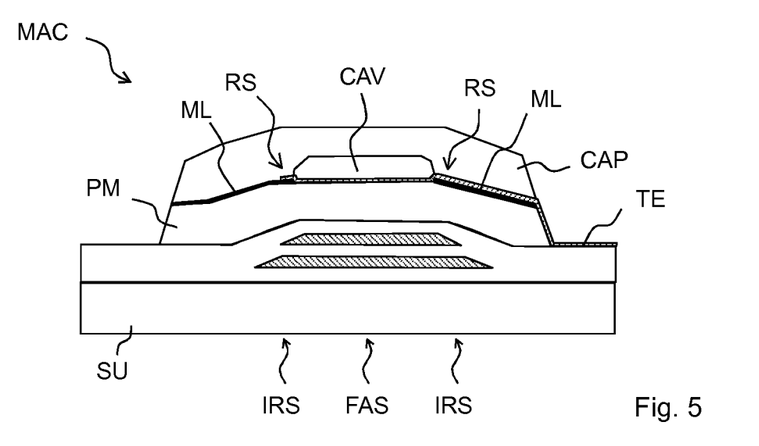
FIG. 5 shows a section through a component that operates with bulk acoustic waves with an additional mass loading.

FIG. 5 shows an embodiment in which, in addition to a top electrode TE, a mass layer ML is arranged in the inner marginal region IRS in order to optimize oscillation modes in the microacoustic component MAC. The cover CAP supports the effect of the metallization of the mass layer ML by virtue of the fact that a part of the cover bears in the inner marginal region IRS. It is possible for the inner edge of the cover at the bearing region to terminate flush with an inner edge of the mass layer ML.

Figure 6:
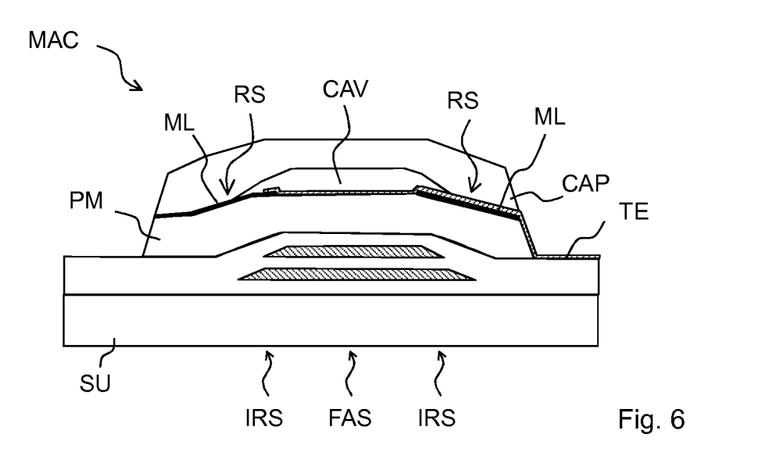
FIG. 6 shows a vertical section through a component that operates with bulk acoustic waves, wherein an edge of the bearing region is arranged on an oblique portion of the piezoelectric layer.

FIG. 6 shows an embodiment in which the inner edge of the bearing surface of the cover CAP is arranged on an oblique portion of the piezoelectric material. The oblique portion is obtained as a result of different sizes of the mirror layers of the acoustic mirror. Depending on the extent to which the inner edge of the cover is drawn in with respect to the functional acoustic region FAS, the greater the acoustic coupling is and the more strongly the cap can influence the oscillation modes.

Figure 7:
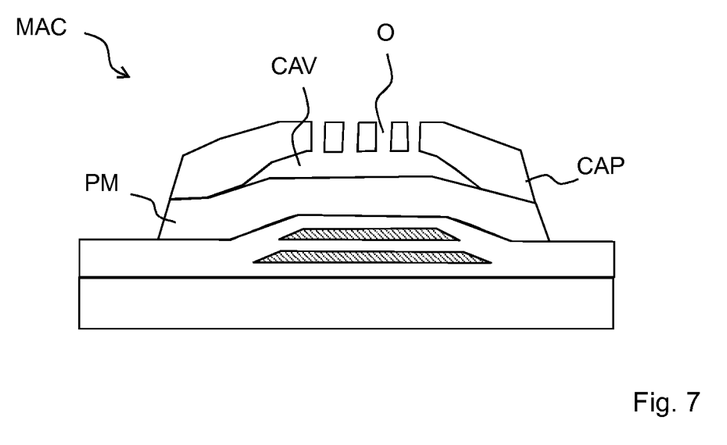
FIG. 7 shows an embodiment with openings in the cover.

FIG. 7 shows an embodiment in which the cover CAP has one or a plurality of openings O. Through the openings, the functional acoustic region can interact with the environment and thus function as a sensor. Furthermore, it is more easily possible to remove a sacrificial layer below the cover CAP after the cover CAP has been applied to the sacrificial layer. If a sacrificial layer was applied before the deposition of the thin film of the cover CAP, then a cavity CAV can be obtained.

Figure 8:
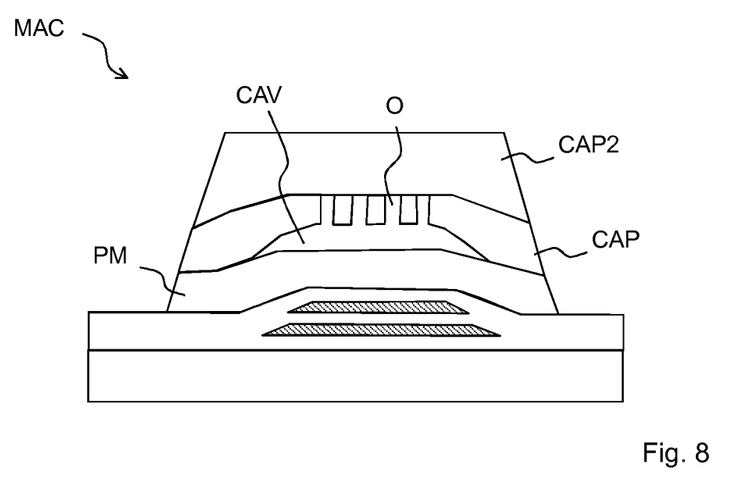
FIG. 8 shows an embodiment with a further cover.

FIG. 8 shows an embodiment in which a further cover CAP2 is arranged on the cover CAP. The further cover can mechanically reinforce the first cover, improve the hermeticity or, if appropriate, constitute an electrostatic shield.

Figure 9:
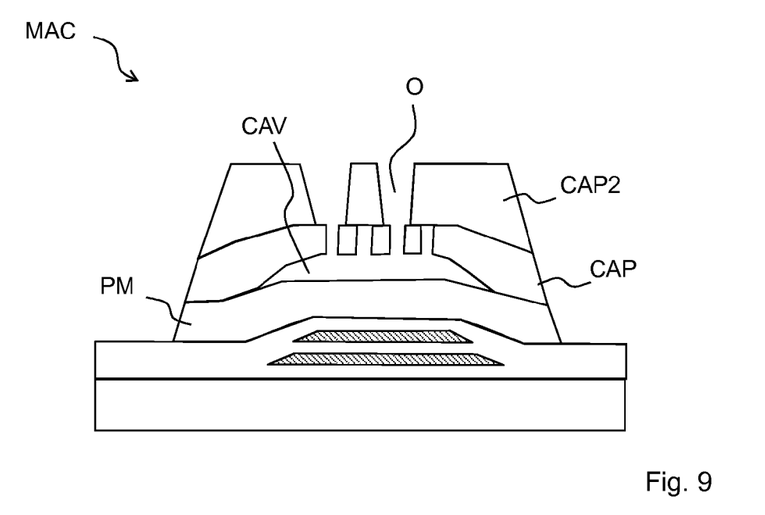
FIG. 9 shows an embodiment with openings in the cover, and in a further cover.

FIG. 9 shows an embodiment in which the further cover CAP2 likewise comprises one or a plurality of openings O in order that the component MAC can function as a sensor.

Figure 10:
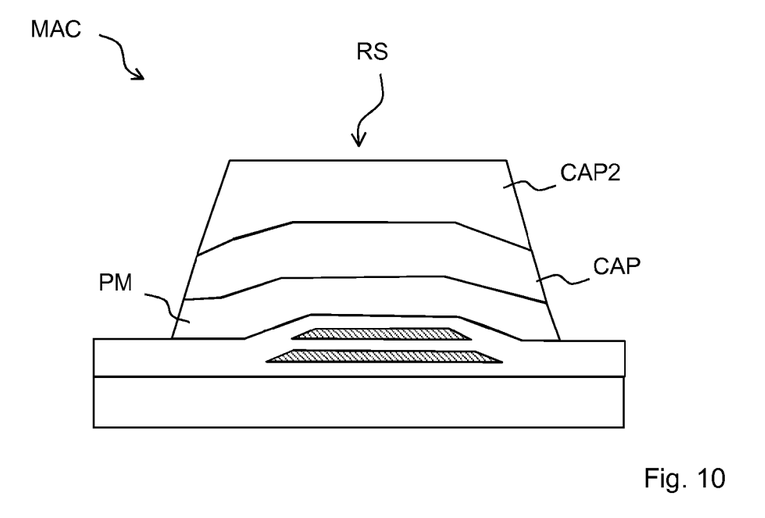
FIG. 10 shows an embodiment without a cavity, wherein the cover bears directly on the functional acoustic region.

FIG. 10 shows an embodiment in which the cover CAP is arranged directly, i.e. without a cavity between the cover CAP and the functional acoustic region. Without a cavity, the bearing surface RS of the cover CAP is also arranged directly with the functional acoustic region, as a result of which the latter can be acoustically detuned. Such a layer stack can be arranged alongside or above another layer stack with or without an active acoustic region.

The microacoustic component is not restricted to any of the embodiments described or of the examples shown in the figures. Combinations of individual features and variations which comprise, e.g., even further layers, electrode structures or covers likewise constitute further embodiments.

The invention claimed is:
1. A micro acoustic component, comprising:
   a functional acoustic region;
   an inner marginal region surrounding the functional acoustic region and being acoustically coupled to the functional acoustic region;
   an outer marginal region surrounding the inner marginal region; and a cover, which covers the functional acoustic region and has a thin film and a bearing surface, wherein the bearing surface bears directly at least on a part of the inner marginal region.

2. The microacoustic component according to claim 1, wherein the microacoustic component comprises interdigital electrode fingers in the functional acoustic region on a piezoelectric material and operates with surface acoustic waves or guided bulk acoustic waves.

3. The microacoustic component according to claim 1, wherein the microacoustic component comprises a piezoelectric material in the functional acoustic region between a bottom electrode surface and a top electrode surface and operates with bulk acoustic waves.

4. The microacoustic component according to claim 1, further comprising an additional mass, wherein the bearing surface bears on the additional mass.

5. The microacoustic component according to claim 4, wherein mass coverage is locally increased in order to suppress undesirable wave modes or to improve waveguiding in the inner marginal region as compared to an identical structure with no additional mass.

6. The microacoustic component according to claim 4, wherein the additional mass comprises a frame structure.

7. The microacoustic component according to claim 6, wherein the bearing surface and the frame structure each have an inner edge and both inner edges terminate flush.

8. The microacoustic component according to claim 1, further comprising a structure that reflects acoustic waves adjacent the functional acoustic region.

9. The microacoustic component according to claim 1, wherein the cover encloses a cavity above the functional acoustic region.

10. The microacoustic component according to claim 1, further comprising a further functional acoustic region and a further cover;
    wherein one cover, selected from the cover and the further cover, encloses a cavity above an associated functional acoustic region selected from the functional acoustic region and the further functional acoustic region; and
    wherein the other cover is arranged directly above the other functional acoustic region, without enclosing a cavity.

11. The microacoustic component according to claim 1, wherein an opening is structured in the cover, such that the functional acoustic region is in contact with an environment outside of the microacoustic component.

12. A micro acoustic component, comprising:
    a functional acoustic region;
    an inner marginal region surrounding the functional acoustic region and being acoustically coupled to the functional acoustic region;
    an outer marginal region surrounding the inner marginal region;
    a cover, which covers the functional acoustic region and has a thin film and a bearing surface, wherein the bearing surface bears directly at least on a part of the inner marginal region; and
    an additional mass arranged so that the bearing surface bears on the additional mass, wherein, in the inner marginal region by means of the additional mass, mass coverage is locally increased in order to suppress undesirable wave modes or to improve waveguiding as compared to an identical structure that includes no additional mass.

13. The microacoustic component according to claim 12, wherein the additional mass comprises a frame structure.

14. The microacoustic component according to claim 12, wherein a cavity between the functional acoustic region and the cover is hermetically sealed.

15. A micro acoustic component, comprising:
    a functional acoustic region;
    an inner marginal region surrounding the functional acoustic region and being acoustically coupled to the functional acoustic region;
    an outer marginal region surrounding the inner marginal region; and
    a cover that covers the functional acoustic region to enclose a cavity above the functional acoustic region, wherein the cover has a thin film and a bearing surface and wherein the bearing surface bears directly on at least a part of the inner marginal region.

* * * * *